(12) United States Patent
Rivoir

(10) Patent No.: US 6,972,704 B2
(45) Date of Patent: Dec. 6, 2005

(54) SIGMA-DELTA MODULATOR WITH PWM OUTPUT

(75) Inventor: Jochen Rivoir, Magstadt (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/854,666

(22) Filed: May 26, 2004

(65) Prior Publication Data

US 2005/0007266 A1 Jan. 13, 2005

(30) Foreign Application Priority Data

Jun. 17, 2003 (EP) .................................. 03101768

(51) Int. Cl.[7] .............................................. H03M 3/00
(52) U.S. Cl. ..................................... 341/143; 341/144
(58) Field of Search ............................... 341/143, 155, 341/144, 118, 120; 330/10

(56) References Cited

U.S. PATENT DOCUMENTS

| | | | |
|---|---|---|---|
| 5,453,995 A | 9/1995 | Behrens | 371/27 |
| 5,499,248 A | 3/1996 | Behrens et al. | 371/22.1 |
| 5,617,058 A * | 4/1997 | Adrian et al. | 330/10 |
| 6,150,969 A * | 11/2000 | Melanson | 341/143 |
| 6,373,417 B1 | 4/2002 | Melanson | 341/143 |
| 6,414,614 B1 * | 7/2002 | Melanson | 341/143 |
| 6,441,760 B2 * | 8/2002 | Albinet et al. | 341/143 |
| 6,462,690 B1 * | 10/2002 | Gaboriau et al. | 341/144 |
| 6,727,832 B1 * | 4/2004 | Melanson | 341/143 |
| 6,795,004 B2 * | 9/2004 | Masuda et al. | 341/143 |
| 2003/0062964 A1 | 4/2003 | Guedon et al. | 332/109 |
| 2003/0090401 A1 | 5/2003 | Yoshizawa | 341/152 |

FOREIGN PATENT DOCUMENTS

| | | |
|---|---|---|
| EP | 882 991 | 3/1999 |
| EP | 0 910 168 | 4/1999 |
| EP | 859 318 | 7/1999 |
| EP | 864 977 | 7/1999 |
| EP | 886 214 | 10/1999 |
| EP | 1 092 983 | 1/2003 |
| WO | WO 00/38327 | 6/2000 |

OTHER PUBLICATIONS

Dufort, et al., "Increasing the Performance of Arbitrary Waveform Generators Using Periodic Sigma-Delta Modulated Streams", IEEE Transactions on Instrumentation and Measurement, vol. 49, No. 1, Feb. 2000, pp. 188-199.

* cited by examiner

Primary Examiner—Peguy JeanPierre
Assistant Examiner—Linh V. Nguyen

(57) ABSTRACT

The present invention relates to a method for providing an improved generated arbitrary waveform using a sigma-delta modulator with pulse width modulation, said method comprising the steps of sigma-delta modulation of said generated arbitrary waveform, and pulse width modulation of the output signal of said sigma-delta modulator, introducing a minimum pulse width (pwmin) during said pulse width modulation.

10 Claims, 3 Drawing Sheets

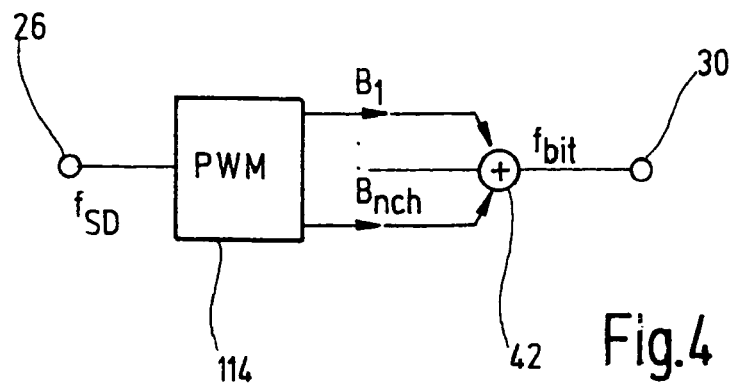
Fig.4
$$f_{bit} = \left(\left\lceil \frac{nlev-1}{nch}\right\rceil + pw_{min}\right) \cdot f_{SD}$$
Fig.5
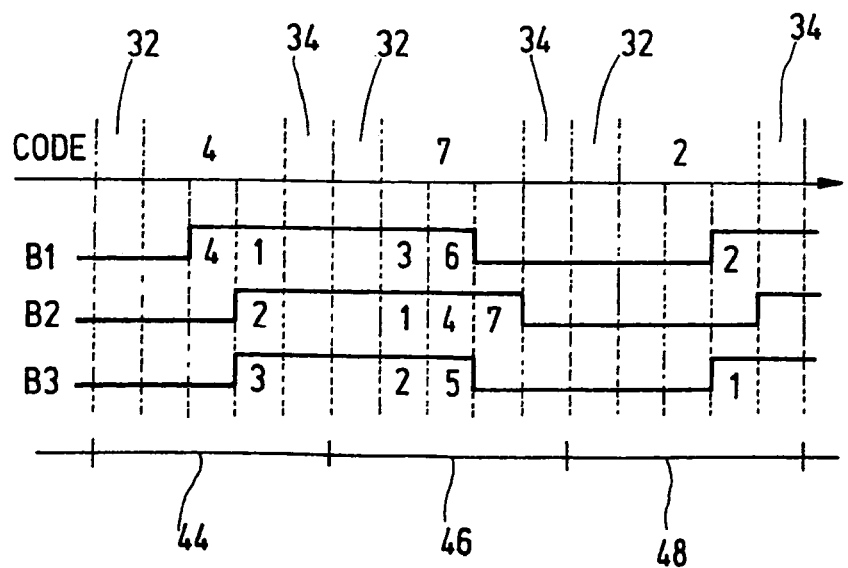
Fig.6

SIGMA-DELTA MODULATOR WITH PWM OUTPUT

BACKGROUND OF THE INVENTION

The present invention relates to the improvement of a generated arbitrary waveform by using a sigma-delta modulator and subsequent pulse width modulation. The improved generated arbitrary waveform can for example be used as a stimulus signal for an electronic device to be tested.

Integrated Circuits (IC) generally need to be tested to assure proper operation. This—in particular—is required during IC development and manufacturing. In the latter case, the ICs are usually tested before final application. During test, the IC, as Device Under Test (DUT), is exposed to various types of stimulus signals, and its responses are measured, processed and usually compared to an expected response of a good device. Automated Test Equipments (ATE) usually perform these tasks according to a device-specific test program. Examples for ATE are the Agilent 83000 and 93000 families of Semiconductor Test Systems of Agilent Technologies as disclosed e.g. under http://www.a-te.agilent.com/ste/products/intelligent test/SOC test/SOC Tech Oview.shtml. Details of those families are also disclosed e.g. in EP-A-859318, EP-A-864977, EP-A-886214, EP-A-882991, EP-A-1092983, U.S. Pat. No. 5,499,248, U.S. Pat. No. 5,453,995.

Arbitrary Waveform Generators (AWG) are used to provide stimulus signals for the DUT. High OverSampling Ratio (OSR), which could be applied in view of ATE with high bit rates, causes jitter-induced noise due to increased number of transitions per time. Thus, the full capability of ATE cannot be exhausted.

SUMMARY OF THE INVENTION

It is an object of the invention to provide an improved generated arbitrary waveform. The object is solved as defined by the independent claims. Preferred embodiments are defined by the dependent claims.

According to embodiments of the present invention, the high timing resolution of a high frequency ATE bit rate can be exploited without increasing the number of transitions. By introducing a minimum pulse width during pulse width modulation the data dependent jitter is reduced. Preferably, the minimum pulse width is pre-determinable and can be adapted to the specific circumstances. Even an automatic adaptation of the minimum pulse width to the specific circumstances is possible, e.g. an automatic adaptation to the data dependent jitter permissible or to the boundary conditions of the ATE.

Preferably a series of numbers is inputted to said sigma-delta modulator as a software version of said desired improved generated arbitrary waveform having a predetermined frequency. For providing said series of numbers an Arbitrary Waveform Generator (AWG) can be used. The sigma-delta modulator is operated at a higher frequency than the frequency of said series of numbers inputted which is the frequency fawg of the Arbitrary Waveform Generator. The ratio of the operation frequency of the sigma-delta modulator and the frequency of the signal at the input of the signal-delta modulator comprises OSR as a factor. Preferably, the sigma-delta modulation is software based.

Preferably, also the pulse width modulation can be software based and being operated at the same or at a higher frequency fbit than the operation frequency of the sigma-delta modulator. The bit stream resulting from the pulse width modulation is filtered, e.g. by a low-pass filter, resulting in an improved generated arbitrary waveform as hardware output signal having the same frequency as the series of numbers at the input of the sigma-delta modulator.

In a preferred embodiment a multi-bit sigma-delta modulation is used with a predetermined number of bit levels to obtain the same noise shaping with a lower OSR, thus reducing the jitter impact.

In a preferred embodiment pulse width modulation is used for digital-to-analog conversion of the multi-level codes of the multi-bit sigma-delta modulator without increasing the number of transitions. Accordingly, increase of clock jitter due to high OSR is avoided. Since multi-bit sigma-delta modulators have better stability, the order of the sigma-delta modulator can be increased to achieve better noise-shaping with the same OSR, or the same noise-shaping with a lower OSR, thus reducing the impact of clock jitter.

Although a pulse width equal to zero is possible according to embodiments of the present invention, in a preferred embodiment a minimum pulse width is guaranteed by the pulse width modulation in order to reduce the effect of unequal rise times and fall times. Preferably the bits for establishing said minimum pulse width are introduced as leading bits and/or trailing bits in each bit stream segment resulting from said pulse width modulation.

By reversing the bit sequence of every second bit stream segment of said bit stream resulting from said pulse width modulation, as a kind of mirroring odd and even bit streams segments, the number of transitions and thus the date dependent jitter is reduced, e.g. by 50%. Preferably, reversing the bit sequence is established by software.

In a preferred embodiment pulse width modulation comprises a number of output channels to be added by analog addition, e.g. by an analog 50 Ω adder. By adding multiple channels more levels in the software modulator can be used in order to provide a better noise shaping at a given maximum bit rate of the ATE.

The ratio of the bit frequency fbit resulting from said analog addition of said output channels and the operating frequency fSD of said sigma-delta modulator is equal to said minimum pulse width plus the integer above the ratio of said number of bit levels minus 1 and said number of output channels.

Preferably bit assignment is rotated between the output channels in order to eliminate effect of unbalanced signal levels of the output channels.

The present invention also relates to a method for testing an electronic device as Device Under Test (DUT) incorporating the above described method for providing an improved generated arbitrary waveform, which is used as a stimulus signal for the DUT.

Furthermore, the present invention relates to a software program or product for executing either the method for providing an improved generated arbitrary waveform and/or the method for testing an electronic device when running on a date processing system such as a computer. Preferably, the program or product is stored on a data carrier.

Furthermore, the present invention relates to a system for providing an improved generated arbitrary waveform comprising a sigma-delta modulator, preferably a multi-bit sigma-delta modulator, for modulating a series of numbers that is or can be regarded as a software version of said improved generated arbitrary waveform. Furthermore, the system comprises a pulse width modulator for pulse width modulation with a minimum pulse width of the output signal of said sigma-delta modulator.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

FIG. 4 shows a pulse width modulator with multiple added outputs, FIG. 5 shows the equation for the frequencies of the pulse width modulator of FIG. 4, and FIG. 6 shows a signal diagram representing the multiple added outputs of the pulse width modulator shown in FIG. 4.

MORE DETAILED DESCRIPTION OF PREFERRED EMBODIMENTS ACCORDING TO THE INVENTION

Figure 1:
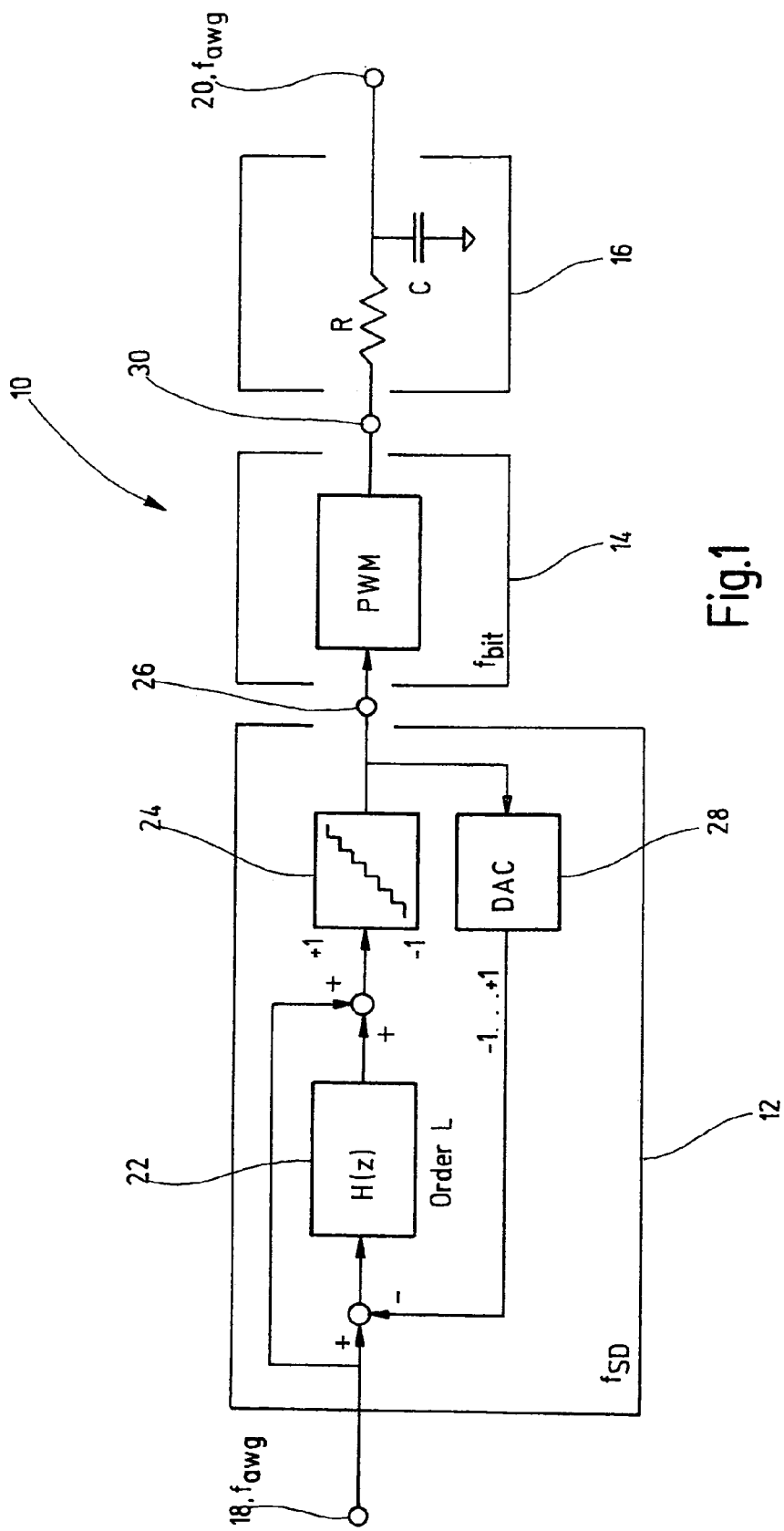
FIG. 1 shows a block diagram of a system for providing an improved generated arbitrary waveform.

FIG. 1 shows a block diagram of a system 10 for providing an improved generated arbitrary waveform. The system 10 comprises a sigma-delta modulator 12, a pulse width modulator 14, and a low pass filter 16. The system 10 receives at its input 18 a series of numbers that can be regarded as a software version or representation of said improved generated arbitrary waveform desired on the output 20 of the system 10. The signal frequency fawg at the input 18 is the same as at the output 20. The signal at the input 18 can be regarded as the generated arbitrary waveform to be improved, and the signal at the output 20 can be regarded as the improved generated arbitrary waveform.

The sigma-delta modulator 12 comprises a signal transfer block 22 having a signal transfer function H(z) in the order L. An allocation block 24 provides the output signal 26 of the sigma-delta modulator 12 having a predetermined number nlev of bit levels. The output signal is also coupled back to the input of the signal transfer block 22 by a Digital/Analog Converter DAC 28. The sigma-delta modulator 12 is operated at a frequency being twice the frequency of the signal at the input 18 and being multiplied by the OverSampling Ratio OSR.

The ratio of the operating frequency fbit of the pulse width modulator 14 and the operating frequency fSD of the sigma-delta modulator 12 is equal to the number nlev of bit levels minus 1 and plus the minimum pulse width pwmin. During the pulse width modulation, the minimum pulse width is guaranteed as can be seen from the figures described below. The output signal 30 of the pulse width modulator 14 is conducted to the filter 16, which is an RC circuit providing low pass filtering. The filter 16 is operated at continuous time.

Figure 2:
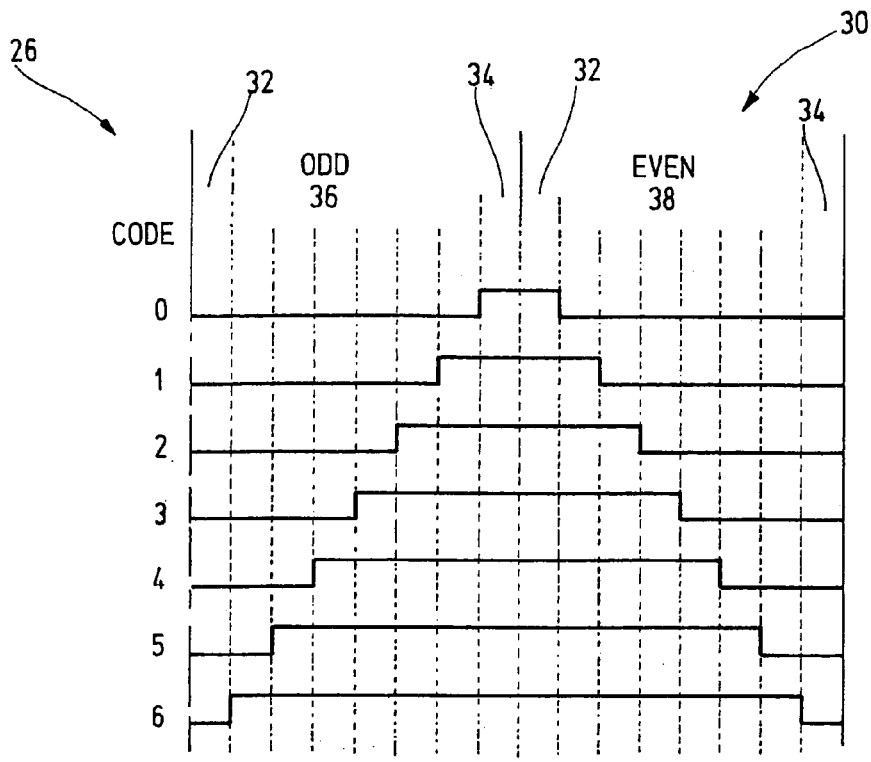
FIG. 2 shows a signal diagram representing pulse width modulation.

FIG. 2 shows a signal diagram representing the signal transfer from the output signal 26 of the sigma-delta modulator 12 being the input signal of the pulse width modulator 14, and the output signal 30 of the pulse width modulator 14. In the shown example, the output signal 26 comprises seven bit levels with CODE 0 to 6. Each code is converted by the pulse width modulation into a bit stream with odd and even bit stream segments 36, 38. Supplemental leading bits 32 and trailing bits 34 are introduced in each bit stream segment 36, 38 guaranteeing a minimum pulse width.

By reversing the bit sequence of every second bit stream segment 38 of the bit stream resulting from the pulse width modulation, i.e. reversing the bit sequence of every EVEN bit segment 38, the number of transitions is reduced as being obvious from FIG. 2.

Figure 3:
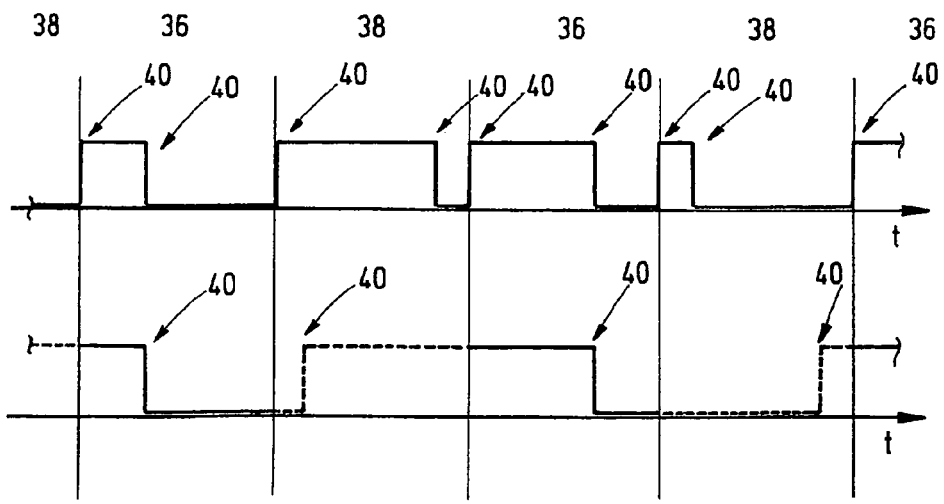
FIG. 3 shows a signal diagram representing reversal of the bit sequence for every second bit stream segment.

FIG. 3 shows two signal diagrams, the upper one in the original form and the lower one with reversed bit sequence for every second bit stream segment 38. In the upper diagram in any bit stream segment 36, 38 there are two transitions 40. By reversing the bit sequence of every second bit stream segment 38 as indicated with broken line in the lower signal diagram, the number of transitions is reduced to one for each bit stream segment 36, 38 and thus by 50%.

FIG. 4 shows a second embodiment for the pulse width modulator 114. As input signal the output signal 26 of the sigma-delta modulator 12 shown in FIG. 1 is used having a signal frequency fFD. The output of the pulse width modulator 114 provides multiple channels B1 to Bnch which are added by an analog adder 42, e.g. a 50 Ω adder, resulting in an output signal 30 having a bit frequency fbit as defined by the equation shown in FIG. 5.

Accordingly the ratio of the bit frequency fbit/fFD is equal to the integer above the ratio of the number of levels nlev provided by the allocation block 24 shown in FIG. 1 minus 1 and the number nch of channels B1 to Bnch of the pulse width modulator 114 shown in FIG. 4 plus the minimum pulse width pwmin. Adding multiple channels allow to use more levels in the software pulse width modulator 114 at a given maximum bit rate fbit of the ATE resulting in a better noise shaping.

FIG. 6 shows signal diagrams for the pulse width modulator 114 shown in FIG. 4. In the example of FIG. 6 the number of levels nlev of the allocation block 24 is 10, the number of channels nch of the pulse width modulator 114 is 3, and the minimum pulse width pwmin is 2. Accordingly two supplemental bits are introduced as leading bits 32 and trailing bits 34 respectively. Bit assignment is rotated in order to eliminate the effect of unbalanced levels. In the first bit stream segment 44 the order of bit assignment is channel B1-B2-B3-B1. In the second bit stream segment 46 the order of bit assignment is channel B2-B3-B1-B2-B3-B1-B2. In the third bit stream segment 48 the order of bit assignment is channel B3-B1.

What is claimed is:

1. A method for providing an improved generated arbitrary waveform comprising:
    a sigma-delta modulator performing a sigma-delta modulation of an input signal defining a desired waveform, and
    a pulse width modulator performing a pulse width modulation on the output signal of the sigma delta modulator,
    wherein a defined minimum pulse width is established by said pulse width modulation,
    wherein said minimum pulse width is defined as a number of bits,
    and wherein the bit(s) for establishing said minimum pulse width is/are inserted as leading bits and/or trailing bit(s) in each bit stream segment of the output signal of said pulse width modulator.

2. A method for providing an improved generated arbitrary waveform comprising:
    a sigma-delta modulator performing a sigma-delta modulation of an input signal defining a desired waveform, and a pulse width modulator performing a pulse width modulation on the output signal of the sigma delta modulator, wherein said sigma-delta modulator provides a multi-bit sigma-delta modulation with a predetermined number of bit levels, and wherein a ratio of an operating frequency of said pulse width modulator and an operating frequency of said sigma-delta modulator is equal to said number of bit levels minus 1 and plus the minimum pulse width introduced during said pulse width modulation.

3. A method for providing an improved generated arbitrary waveform comprising:

a sigma-delta modulator performing a sigma-delta modulation of an input signal defining a desired waveform, and a pulse width modulator performing a pulse width modulation on the output signal of the sigma delta modulator, wherein a defined minimum pulse width is established by said pulse width modulation, the method including reversing the bit sequence of every second bit stream segment of the output signal of said pulse width modulator.

4. The method of claim 3, wherein the input signal consists of a series of numbers representing the improved generated arbitrary waveform.

5. The method of claim 3, wherein said pulse width modulator provides a number of output channels to be added by an analog adder.

6. The method of claim 5, wherein a ratio of an operating frequency of said pulse width modulator and an operating frequency of said sigma-delta modulator is equal to the minimum pulse width introduced during said pulse width modulation plus the integer above the ratio of said number of bit levels minus 1 and said number of output channels.

7. The method of claim 6, wherein bit assignment is rotated between said output channels.

8. A method for testing an electronic device, wherein said method for testing comprises performing a sigma-delta modulation of an input signal defining a desired waveform, and performing pulse width modulation of the sigma-delta modulated input signal, wherein a minimum pulse width is established during said pulse width modulation, and wherein said improved generated arbitrary waveform is used as a stimulus signal for said electronic device, the method including reversing the bit sequence of every second bit stream segment of a result of the pulse width modulation.

9. A software program or product, preferably stored on a data carrier, for executing the method of claim 3, when running on a data processing system such as a computer.

10. A system for providing a generated arbitrary waveform, said system comprising:

a sigma-delta modulator for performing a sigma delta modulation on an input signal defining a desired waveform, a pulse width modulator for performing a pulse width modulation on the output signal of the sigma delta modulator wherein further means are comprised for establishing a minimum pulse width during said pulse width modulation, and circuitry for reversing the bit sequence of every second bit stream segment of an output signal of the pulse width modulator.

* * * * *